United States Patent [19]
Decker et al.

[11] Patent Number: 5,992,268
[45] Date of Patent: Nov. 30, 1999

[54] AMORPHOUS DIAMOND COATING OF BLADES

[76] Inventors: Thomas G. Decker, 257 Pheasant Ave., Arlington, Mass. 02154; Gregory P. Lundie, 11743 Fenton St., Westminster, Colo. 80021; David L. Pappas, 603A Kings Way, Waltham, Mass. 02154; Richard P. Welty, 4279-C Monroe Dr., Boulder, Colo. 80303; C. Robert Parent, 69 Hawthorne St., Westwood, Mass. 02090

[21] Appl. No.: 08/877,522

[22] Filed: Jun. 17, 1997

Related U.S. Application Data

[62] Division of application No. 08/825,405, Mar. 27, 1997, which is a continuation of application No. 08/232,928, Apr. 25, 1994.

[51] Int. Cl.$^6$ ..................................................... C23L 4/00
[52] U.S. Cl. ............... 76/104.1; 26/DIG. 9; 26/DIG. 11; 30/346.54
[58] Field of Search ................. 30/346.53, 346.54, 30/350; 76/104.1, DIG. 8, DIG. 11; 204/192.15, 192.16, 192.3, 298.28

[56] References Cited

U.S. PATENT DOCUMENTS

| | | | |
|---|---|---|---|
| 3,635,811 | 1/1972 | Lane | 30/346.53 X |
| 3,829,969 | 8/1974 | Fischbein et al. | 30/346.53 X |
| 4,492,845 | 1/1985 | Kijuchko . | |
| 4,720,918 | 1/1988 | Curry et al. | 30/346.55 |
| 4,724,058 | 2/1988 | Morrison | 204/192.38 |
| 4,933,058 | 6/1990 | Bache et al. | 204/192.3 |
| 5,032,243 | 7/1991 | Bache et al. | 204/192.34 |
| 5,037,522 | 8/1991 | Vergason | 204/192.38 X |
| 5,088,202 | 2/1992 | Boland et al. | 30/346.54 |
| 5,129,289 | 7/1992 | Boland et al. | 76/104.1 |
| 5,142,785 | 9/1992 | Grewal et al. | 30/32 |
| 5,232,568 | 8/1993 | Parent et al. | 204/192.3 |
| 5,279,723 | 1/1994 | Falabella et al. | 204/192.38 |
| 5,295,305 | 3/1994 | Hahn et al. | 30/50 |

FOREIGN PATENT DOCUMENTS

| | | |
|---|---|---|
| A 207 467 | 1/1987 | European Pat. Off. . |
| A-0 509 875 | 10/1992 | European Pat. Off. . |
| 1097839 | 4/1989 | Japan . |
| WO 87/04471 | 7/1987 | WIPO . |
| WO 93/09921 | 5/1993 | WIPO . |

OTHER PUBLICATIONS

Cuomo, Pappas, Lossy, Doyle, Bruley, DiBello and Krakow, Energetic Carbon Deposition at Oblique Angles, J.Vac-.Sci.Technol.A. 10(6) Nov./Dec. 1992, 3414–3418.

Falabella, Boercker and Sanders, Fabrication of Amorphous Diamond Films, Thin Solid Films 236 (1993), pp. 82–86.

Robertson, Amorphous Carbon, Current Opinion in Solid State & Materials Science, 1966, 1:557–561.

Milne, Tetrahedrally Bonded Amorphous Carbon, Journal of Non–Crystalline Solids, 198–200 (1996) 605–610.

*Primary Examiner*—Douglas D. Watts
*Attorney, Agent, or Firm*—Davis, Graham & Stubbs, LLP

[57] ABSTRACT

Improved razors and razor blades and processes for producing razor blades or similar cutting tools with sharp and durable cutting edges, by hard-carbon coating of blades with amorphous diamond, preferably using a filtered cathodic arc plasma source. A coating of amorphous diamond having at least 40 percent sp3 carbon bonding, a hardness of at least 45 gigapascals and a modulus of at least 400 gigapascals is applied to the sharpened edge of a substrate. The substrate may be mechanically honed, and there is no interlayer between the substrate and the amorphous diamond coating. The coating imparts stiffness and rigidity to a thin blade while maintaining a high aspect ratio.

26 Claims, 2 Drawing Sheets

AMORPHOUS DIAMOND COATING OF BLADES

This is a divisional of copending application(s) Ser. No. 08/825,405 filed on Mar. 27, 1997, which is, in turn, a file wrapper continuation of application Ser. No. 08/232,928 filed on Apr. 25, 1994.

FIELD OF THE INVENTION

This invention relates to improved razors and razor blades and to processes for producing razor blades or similar cutting tools with sharp and durable cutting edges, and in particular to amorphous diamond coating of blades using a filtered cathodic arc plasma source. The invention has particular utility for forming a very hard and rigid coating of high aspect ratio on very thin cutting edges of razor blades.

BACKGROUND OF THE INVENTION

A razor blade typically is formed of suitable substrate material such as metal or ceramic, and an edge is formed with wedge-shape configuration with an ultimate edge or tip that has a radius of less than about 1,000 angstroms, the wedge shaped surfaces having an included angle of less than 30°. As shaving action is severe and blade edge damage frequently results and to enhance shavability, the use of one or more layers of supplemental coating material has been proposed for shave facilitation, and/or to increase the hardness and/or corrosion resistance of the shaving edge.

A number of such coating materials have been proposed, such as polymeric materials and metals, as well as other materials including diamond-like carbon (DLC) material. Each such layer or layers of supplemental material must have adhesion compatibility so that each layer remains firmly adhered to the substrate throughout the useful life of the razor blade, and desirably provide characteristics such as improved shavability, improved hardness and/or corrosion resistance while not adversely affecting the geometry and cutting effectiveness of the shaving edge.

U.S. Pat. No. 5,032,243 of Bache et al. describes blade substrate materials sharpened by ion bombardment from ion sources having the axes of their beams directed at the edges of the razor blades. U.S. Pat. No. 5,232,568 of Parent et al. and U.S. Pat. No. 5,295,305 of Hahn et al. show blades which have an interlayer interposed between the substrate and the diamond-like coating, wherein the interlayer is deposited on the substrate and then the diamond-like coating is deposited on the interlayer.

The prior solutions are not entirely successful, and it would be desirable simply to use mechanical honing processes to form the sharpened substrate (rather than the ion beam formation shown in Bache et al.) followed by a direct deposition of amorphous diamond coating on the substrate (without the intervening step of depositing an interlayer). It would be desirable, therefore, to be able to start with a thin blade substrate produced by mechanical honing and to impart both rigidity and hardness to the substrate by depositing an amorphous diamond coating directly on the substrate.

SUMMARY OF THE INVENTION

According to this invention, the cutting edges of razor blades are provided with improved mechanical properties by applying to the sharpened edge of the substrate a coating of an amorphous diamond material. Such materials may be characterized as having at least 40 percent sp3 carbon bonding, a hardness of at least 45 gigapascals and a modulus of at least 400 gigapascals. In addition, such materials are not corroded by hot aqueous solutions and compounds commonly used in shaving. Materials having these characteristics will be denoted as amorphous diamond in the further course of this disclosure. In contrast to the amorphous diamond material of this invention, traditional diamond-like carbon coatings (DLC) produced by such traditional methods as sputtering do not exhibit such high hardnesses. Unlike the amorphous diamond of this disclosure, DLC coatings typically have hardnesses not exceeding 30 gigapascals.

The extreme hardness and rigidity of the applied amorphous diamond coating can provide strength to a very thin razor blade edge. U.S. Pat. No. 4,720,918 of Curry et al. describes edges of this type, and they are included here as examples and need not be considered limiting. A very thin blade edge can provide increased shaving comfort, but is practical only if the edge is strong enough to withstand shaving. A thin edge, including but not limited to those described in U.S. Pat. No. 4,720,918, strengthened by 400 to 2000 angstroms of amorphous diamond will comprise a finished edge which is significantly thinner than edges presently used for shaving, coupled with sufficient strength to withstand shaving, this due to the extraordinary strength of the amorphous diamond coating.

Further contributing to a thin edge is the large aspect ratio attainable by the particular cathodic arc deposition process used in this invention for manufacture of amorphous diamond coatings. The "aspect ratio" is explained in greater detail with reference to FIG. 3 in the discussion which follows, but may be understood for purposes of this summary as being the ratio of (a) to (b) where (a) is a first distance from the tip of the coating to the tip of the substrate, and (b) is a second distance from a surface of the coating to the tip of the substrate.

The aspect ratio provides a useful measure of the effect of a coating on the underlying blade edge geometry of the substrate—the larger or higher the aspect ratio of the coating, the "sharper" is the coated blade compared to a blade coated at a lower aspect ratio. As a further consequence of the extraordinary strength of the amorphous diamond coatings of this invention, application of such a coating to a razor blade of normal cross-section will be expected to provide longer shaving life.

In accordance with one aspect of the invention, there is provided a wedge-shaped edge and a layer of amorphous diamond on the tip and flanks of the wedge-shaped edge, preferably with a thickness of at least 400 angstroms, which defines a tip radius of less than about 500 angstroms and an aspect ratio of 2:1 to 4:1. The blade exhibits excellent shaving properties and long life.

In preferred embodiments, the razor blade substrate is steel, the amorphous diamond coating is at least four times as hard as the steel substrate; the wedge-shaped edge is formed by a sequence of mechanical abrading steps; and the layer of amorphous diamond is formed of carbon ions provided from a graphite target used as a filtered cathodic arc source.

In accordance with another aspect of the invention, there is provided a process for forming a razor blade that includes the steps of providing a substrate; forming on an edge of the substrate a wedge-shaped sharpened edge that has an included angle of less than 30° and a tip radius (i.e. the estimated radius of the largest circle that may be positioned within the ultimate tip of the edge when such ultimate tip is viewed under a scanning electron microscope at magnifications of at least 25,000) preferably of less than 1,200 angstroms; and depositing, by filtered cathodic arc evaporation, a layer of amorphous diamond on the sharpened edge to provide a radius at the ultimate tip of the amorphous diamond layer of less than about 1000 angstroms. The amorphous diamond layer may be deposited by several techniques, all having in common the energetic deposition of carbon as a highly ionized species. While methods of cathodic arc, anodic arc, plasma decomposition of hydrocarbon gases, sputtering with post-ionization by inductively coupled rf, laser ablation, laser absorptive wave deposition (LAWD) and direct ion beam deposition might be used for this purpose, the preferred embodiment of this invention uses a filtered cathodic arc.

In a particular process, the substrate is mechanically abraded in a sequence of honing steps to form the sharpened edge; a layer of amorphous diamond is deposited by filtered cathodic arc, the amorphous diamond coating on the cutting edge having a thickness of at least 400 angstroms, the layer of amorphous diamond having at least 40 percent sp3 carbon bonding, a hardness of at least 45 gigapascals; and an adherent polymer coating may be applied on the amorphous diamond coated cutting edge.

In accordance with another aspect of the invention, there is provided a shaving unit that comprises blade support structure that has external surfaces for engaging user skin ahead and rearwardly of the blade edge or edges and at least one blade member secured to the support structure. The razor blade structure secured to the support structure includes a substrate with a wedge-shaped cutting edge defined by facets that have an included angle of less than seventeen degrees at a distance of forty micrometers from the sharpened tip, and a layer of a strengthening material which has a thickness of at least 400 angstroms from the sharpened tip of said substrate to a distance of forty micrometers from the sharpened tip, a radius at the ultimate tip of the strengthening material of less than 500 angstroms and an aspect ratio in the range of 2:1 to 4:1.

In a particular shaving unit, the razor blade structure includes two steel substrates, the wedge-shaped edges are disposed parallel to one another between the skin-engaging surfaces, the edge strengthening layer is of amorphous diamond with a thickness of about 1000 angstroms (typically a range of 400–2000 angstroms depending on substrate and processing parameters) and is characterized by at least 40 percent sp3 carbon bonding and a hardness of at least 45 gigapascals; and an adherent polymer coating is on each layer of amorphous diamond material.

The shaving unit may be of the disposable cartridge type adapted for coupling to and uncoupling from a razor handle or may be integral with a handle so that the complete razor is discarded as a unit when the blade or blades become dull. The front and rear skin engaging surfaces cooperate with the blade edge (or edges) to define the shaving geometry. Particularly preferred shaving units are of the types shown in U.S. Pat. No. 3,876,563 and in U.S. Pat. No. 4,586,255.

Other features and advantages of the invention, including process conditions for applying the desired amorphous diamond coating will be seen as the following description of particular embodiments progresses, in conjunction with the drawings.

DETAILED DESCRIPTION OF THE INVENTION

In the description which follows, the characteristics and properties of various preferred embodiments of the blade, substrate and amorphous diamond coating will be disclosed, followed by a disclosure of process conditions for depositing the desired coating.

Figure 1:
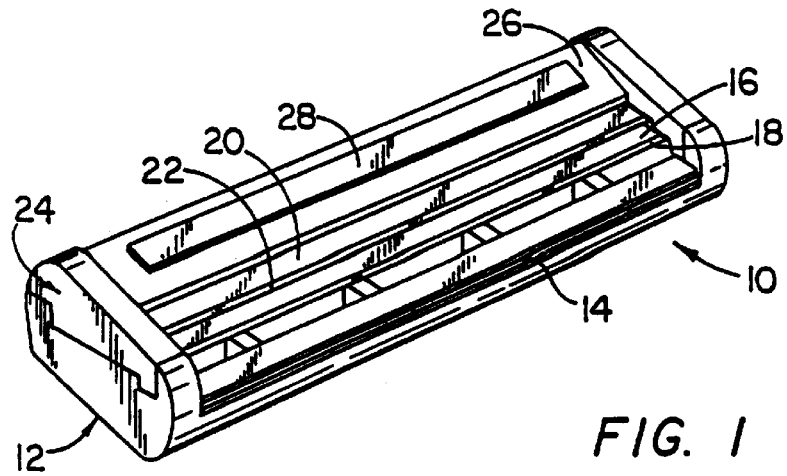
FIG. 1 is a perspective view of a shaving unit in accordance with the invention.

With reference to FIG. 1, shaving unit 10 includes structure for attachment to a razor handle, and a platform member 12 molded of high-impact polystyrene that includes structure defining forward, transversely-extending skin engaging surface 14. Mounted on platform member 12 are leading blade 16 having sharpened edge 18 and following blade 20 having sharpened edge 22. Cap member 24 of molded high-impact polystyrene has structure defining skin-engaging surface 26 that is disposed rearwardly of blade edge 22, and affixed to cap member 24 is shaving aid composite 28.

Figure 2:
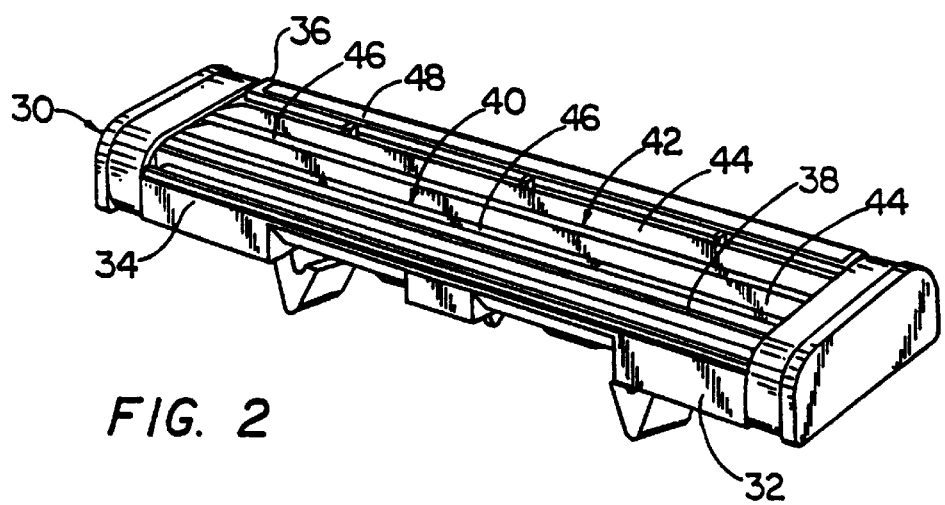
FIG. 2 is a perspective view of another shaving unit in accordance with the invention.

The shaving unit 30 shown in FIG. 2 is of the type shown in U.S. Pat. No. 4,586,255 of Jacobson and includes molded body 32 with front portion 34 and rear portion 36. Resiliently secured in body 32 are guard member 38, leading blade unit 40 and trailing blade unit 42. Each blade unit 40, 42 includes a blade member 44 that has a sharpened edge 46. A shaving aid composite 48 is frictionally secured in a recess in rear portion 36.

Figure 3:
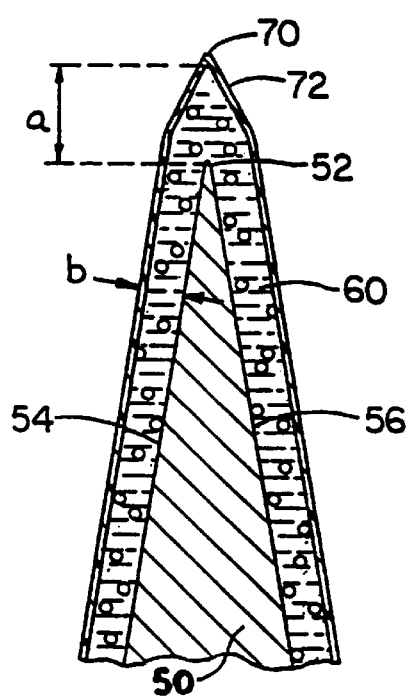
FIG. 3 is a diagrammatic view illustrating one example of razor blade edge geometry in accordance with the invention.

A diagrammatic view of the edge region of the blades 16, 20 and 44 is shown in FIG. 3, from which the aspect ratio may be better understood. The blade includes stainless steel body portion 50 with a wedge-shaped sharpened edge formed in a sequence of edge forming honing operations that forms a tip portion 52 that has a radius typically less than 500 angstroms with facets 54 and 56 that diverge at an angle of about 13°. Deposited on tip 52 and facets 54, 56 is amorphous diamond 60 that has a thickness of about 2,000 angstroms, with an aspect ratio (the ratio at distance (a) from amorphous diamond tip 70 to stainless steel tip 52, and the width (b) of the amorphous diamond coating 60 to tip 52) of about 3:1.

Deposited on layer 60 is an adherent telomer layer 72 that has a substantial as deposited thickness but is reduced to monolayer thickness during initial shaving.

Figure 4:
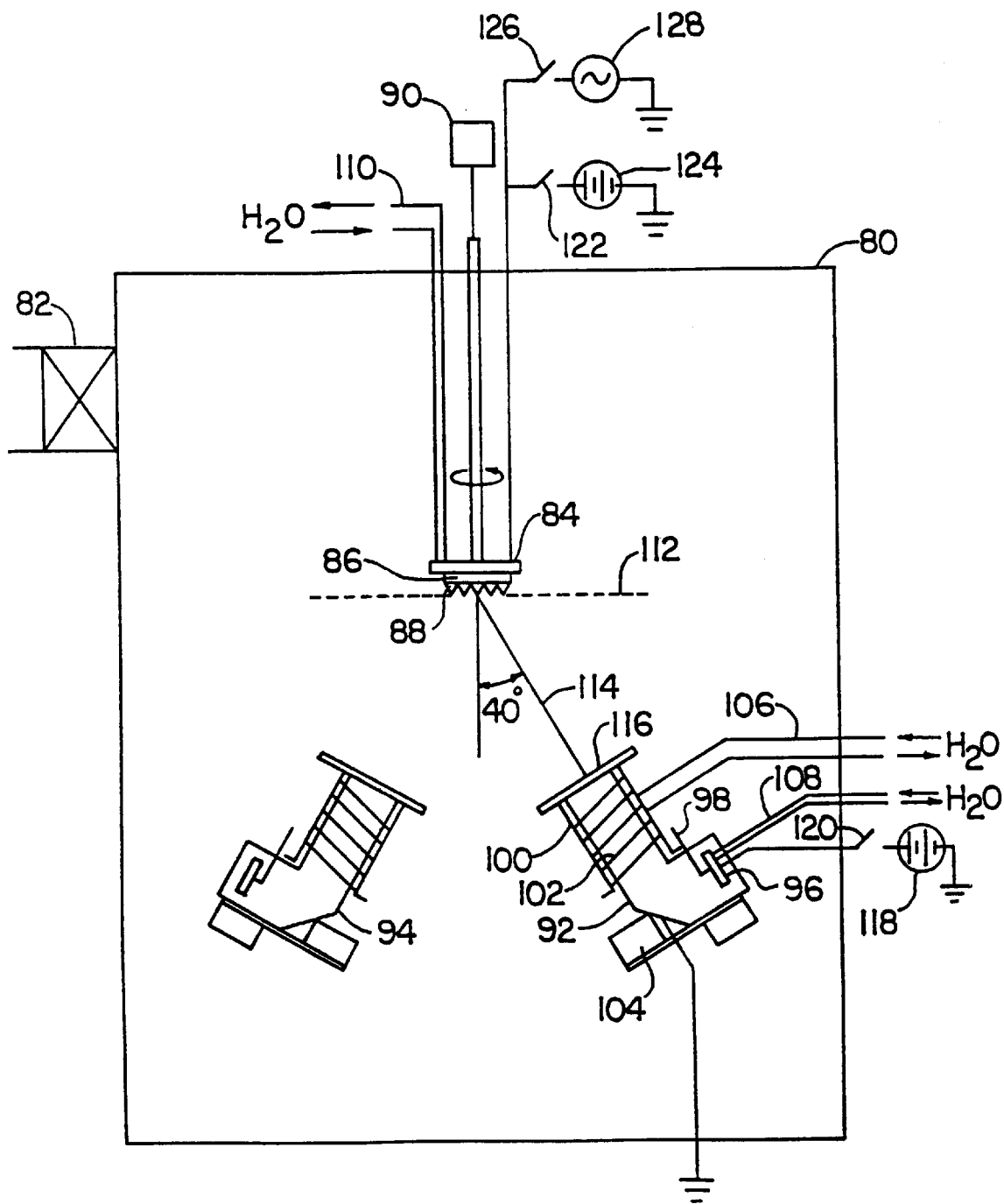
FIG. 4 is a diagrammatic view of apparatus for the practice of the invention.

An apparatus for processing blades of the type shown in FIG. 3 is schematically illustrated in FIG. 4. That apparatus includes a filtered cathodic arc deposition system, such as one manufactured by Vapor Technologies of Boulder, Colo. that has stainless steel chamber 80 which is coupled to a vacuum pumping system (not shown) through valve 82. Mounted in chamber 80 is an electrically isolated, water cooled substrate platform 84 on which is disposed a rotatable fixture 86 which holds a stack of razor blades 88.

The sharpened edges are aligned perpendicularly to the plane of the drawing and face downward from the support 86. Motor 90 fixed outside the chamber 80 provides 180 degrees of rotation of the blade stack at predetermined intervals for the purpose of alternately exposing each blade edge to the beam of carbon ions from a single cathodic arc source 92, insuring uniform deposition on both blade bevels.

Also disposed in chamber 80 are two filtered cathodic arc sources 92,94, each consisting of a graphite target 96 (cathode, 99.99% purity), an arc striking mechanism 98, and a filter or duct 100. The filter 100 serves to direct the flow of carbon ions (the arc plasma) from the cathode 96 to the blade stack 88, through the use of solenoidal magnetic fields, produced by electrical windings 102 along the length of the duct and an electromagnet 104 positioned under the duct. The cathodic arc source may also be of the type described in, and the magnetic fields may be controlled so as to optimize the performance of the arc relative to the sources as described in co-pending U.S. Pat. No. 5,480,527 of Welty, incorporated by reference herein. Water cooling lines 106, 108 and 110 are provided for the target 96, duct 92 and blade support 86, respectively.

The duct is so directed to provide an angle of 40 degrees between the plane 112 presented by the blade tips and the center axis 114 of the duct exit 114. This angle is chosen to insure that a fully dense coating is deposited. The graphite target 96 is approximately 30 centimeters long by 2.5 centimeters wide and is electrically insulated from the chamber 80, while the duct 100 is at ground potential. The graphite target 95 is connected to a DC power supply 118 through switch 120. Electrical wiring is provided to connect blade stack 88 through switch 122 to DC power supply 124 or through switch 126 to RF power supply 128. The details of a preferred filtered cathodic arc design and operation are discussed further in the previously mentioned co-pending U.S. Pat. No. 5,480,527 of Welty.

Rotatable mount 86 supports the blade stack 88 with edges spaced 15 centimeters from the mouth of the filter duct. The blade stack 88 is rotated between a position where one bevel faces the duct 92, and a similar position where the opposite bevel faces the duct 92. This rotation of 180 degrees is carried out every 10 seconds, insuring the bevels are coated equally.

In one example of a particular processing sequence, a stack of blades 88 (2.5 centimeters long) is secured on the rotatable mount 86, the support cooling water is turned on, and the chamber 80 is evacuated. The pressure to chamber 80 is adjusted to 50 millitorr with flowing argon. Switch 122 is closed to provide −400 volts DC to the blade stack, igniting a DC plasma discharge in which the blades are cleaned for ten minutes. After the cleaning step, (i) the pressure in the chamber is adjusted to 0.1 millitorr of argon, (ii) the field coils 102 to a single duct 92 are energized, (iii) switch 120 to graphite target 96 is closed, (iv) the power supply 124 to the blades is adjusted to −1000 volts DC, and (v) an arc is struck/initiated on graphite target 96 with mechanical striker 98. The arc current is set to 100 A. An intense plasma of carbon ions is emitted from duct 92 and is deposited on the blades 88, which rotate 180 degrees every 10 seconds.

After the arc has run for 2 minutes, the bias supply 124 is set to −50 volts and deposition continues for a total time of 16 minutes. The resultant amorphous diamond blade coating is approximately 1000 angstroms in thickness on each facet. The blade tip radius is approximately 350 angstroms, and the aspect ratio is approximately 2.5:1.

In another example of the processing sequence, the two cathodic arc sources are simultaneously operated, with the second source 94 positioned opposite the first source 92, so that both blade facets are simultaneously coated at approximately the same angle of incidence. In this case, the blade stack 88 is not rotated, but is rather translated through the region where the plasmas emitted from both sources intersect. All other aspects of the processing sequence are identical to those indicated above.

A coating 72 of polyterrafluorethylene (PTFE) telomer is then applied to the amorphous diamond coated edges of the blades. The process involves heating the blades in a neutral atmosphere of argon and providing on the cutting edges of the blades an adherent and friction-reducing polymer coating of solid PTFE. Coatings 72 and 60 were firmly adherent to the blade body 50, provided low wet wool felt cutter force (the lowest of the first five cuts with wet wool felt (L5) being about 0.45 kilogram), and withstood repeated applications of wool felt cutter forces indicating that the amorphous diamond coating 60 is substantially unaffected by exposure to the severe conditions of this felt cutter test and remains firmly adhered to the blade body 50, even after immersion in 80° C. distilled water for sixteen hours.

Resulting blade elements 44 were assembled in cartridge units 30 of the type shown in FIG. 2 and shaved with excellent shaving results.

Process Conditions

The foregoing disclosure of the characteristics and properties of the blades, substrates and amorphous diamond coatings may be further understood and enhanced by the following specific description of suitable process conditions generally described above. First, the preferred cathodic arc sources will be summarized. Then various preferred process conditions will be described.

Cathodic Arc Source. A deposition coating of amorphous diamond may be applied using conventional filtered cathodic arc plasma source material as described in U.S. Pat. No. 5,279,723 of Falabella et al. However, in a preferred embodiment, the deposition coating is applied according to the previously referenced co-pending application. Although the rectangular source is particularly suited to the practice of this invention, the invention is not so limited. Likewise, an unfiltered or other conventional source may be used, and this invention should not be understood as being limited to filtered cathodic arc sources.

Process Conditions and Adjustments. Process conditions include a multi-step bias to the substrate; an equal average deposition on both sides of the blade; and attention to the angle of presentation.

An initial high bias in the range of 200–2000 volts is applied to the substrate during deposition for up to two minutes to establish adhesion. A second stage lower bias in the range of 10–200 volts is then applied to optimize the structure of the amorphous diamond hard carbon coating and to establish the desired crystal structure. Although at least the foregoing two stages are desirable according to this invention, it may also be desirable to provide a further "step down" incremental bias voltage reduction as, for example by adding an intermediate bias stage at 500 volts.

The amorphous diamond deposition is laid down at an equal average rate (or simultaneously) on both sides of the blade. By setting at least dual sources for simultaneous deposition and/or cycling the angle of presentation of the blade set relative to the deposition source, the coating layer will be applied equally or at an equal average rate of deposit, on both sides. In light of the fact that the blades each have a cutting edge bounded by a first inclined surface and a second inclined surface, coming to a tip at the juncture of the inclined surfaces and that a set of blades:

may be disposed as a stack of blades presenting a plane surface formed by the tips, or
   may be disposed in a carousel, or otherwise;

the layered concept involves either (i) using at least two sources so that the deposition rate is instantaneously equal on both sides of the cutting edge, or (ii) employing a movement of the blade set (stack or carousel) relative to a single source (a cyclic alternation of the presentation of the blades with respect to the source, as by a flipping of the stack, a rotation of the carousel, or other sequential presentation) in order that a coating will be laid down on both sides of the cutting edge of each razor at an approximately equal rate over time.

That is, in order to apply a coating of 1000 angstroms in thickness, a preferred method of this invention would not lay down all 1000 angstroms on the first side and then lay down all 1000 angstroms on the second side of a blade stack—instead, it would be either (i) a simultaneous deposition on both sides or (ii) a cyclic alternation in a range of 3 to 500 angstroms on the first side then 3 to 500 angstroms on the second side, and so on until the 1000 angstrom or other desired thickness is built on both sides of the cutting edge of each blade. While the foregoing is a preferred method, the invention is not to be understood as so limited, and may be practiced with an uneven or unbalanced layering.

It should be understood that the angle of presentation is of some concern. The low pressure (high vacuum) conditions produce a highly directional plasma stream of ionized carbon. The blades are presented at an angle measured from a line normal to the plane formed by the tips of the stacked blades (or measured from the line bisecting the angle enclosed by the tip and -he first and second inclined surfaces of the cutting edge of an unstacked blade) that is greater that 20° but less than 90°. The angle of presentation is intended to direct the plasma stream more directionally against one or the other sides of the cutting edges of the blades.

As is conventionally known, the deposition process of this invention may be operated with or without a process gas such as argon; cleaning of the chamber may be accomplished with RF or DC glow discharge; and biasing of the substrate may be done with DC or RF sources (and such biasing may be used to shape the tip of the blade).

It should now be seen that this invention permits the strengthening of a thin blade while maintaining sharpness (that is, imparting stiffness and rigidity to the thin blade without ruining the acuteness or sharpness of the tip). Where a more conventional razor blade might be coated to a thickness in the order of a magnitude of about 100 to 350 angstroms, the method of this invention will deposit an amorphous diamond coat perhaps as high as 3,000 angstroms in thickness (as measured on the blade surface disposed away from the tip) and as high as 5,000 angstroms measured at the tip. As previously mentioned, all of this is achieved while maintaining a high aspect ratio.

It might be noted that the razor blades intended to be coated by this method are expected to be thinner than the usual razor blade, and sharper, and that the 2:1 and higher aspect ratios permitted by the process of this invention, coupled with the enormous strength of the amorphous diamond hard carbon coating, puts the blade in a class by itself.

What is claimed is:

1. A method for applying a hard carbon coating to a blade having a cutting edge bounded by a first inclined surface and a second inclined surface and an included blade angle enclosed by said first and second inclined surfaces, said method comprising the steps of:
   (a) applying an arc discharge to an evaporable carbon surface of a cathode, thereby generating a plasma stream of vaporized carbon in a generally directional stream resolvable into a set of roughly parallel lines,
   (b) orienting a blade to be coated within said plasma stream so that an angle measured from a line bisecting said included blade angle and one of said set of roughly parallel lines is within the range of 20° to 90°, thereby exposing one of said first and second inclined surfaces of the cutting edge of the blade to the plasma stream at said angle, and
   (c) presenting said blade in relation to the plasma stream so that said deposition of vaporized carbon occurs on said first inclined surface of the cutting edge of the blade and on the second inclined surface of the cutting edge of the blade,
   wherein said deposition of vaporized carbon on said first and second inclined surfaces of the cutting edge occurs at an approximately equal average rate of deposition.

2. The method of claim 1 wherein said blade is held within a stack containing a plurality of stacked blades, and said steps of orienting a blade and presenting said blade are performed simultaneously on said plurality of stacked blades.

3. The method of claim 2 wherein
   (a) each of said plurality of blades within said stack has a tip at the juncture of the first and second inclined surfaces of the cutting edge of the blade and the blades are stacked so that the tips describe a plane,
   (b) and said step of orienting a blade further comprises the step of so disposing the blade that an angle defined by a line normal to said plane is within the range of 20° to 90° said line normal to said plane being roughly parallel to said line bisecting said included blade anggle, thereby exposing one of said first and second inclined surfaces of the cutting edge of the blade to the plasma stream at said angle.

4. The method of claim 3 wherein said step of presenting includes the step of exposing each of the first and second inclined surfaces of the cutting edge of the blade to the plasma stream at said angle.

5. The method of claim 4, wherein said step of exposing each of the first and second inclined surfaces of the cutting edge of the blade includes the further step of moving the stack of blades and the plasma stream relative to one another, thereby sequentially exposing each of said first and second inclined surfaces to said plasma stream so that an incremental deposition layer may form on each of said surfaces during said sequential exposure.

6. The method of claim 5, wherein said incremental deposition layer is in the range of 3 Å to 500 Å and said moving step is repeated until at least two incremental deposition layers are deposited on each of the first and second inclined surfaces of the cutting edge of the blade.

7. The method of claim 4, wherein said step of exposing each of the first and second inclined surfaces of the cutting edge of the blade further includes using a second plasma generating means for generating a second plasma stream of vaporized carbon in conjunction with said filtered cathodic arc source, thereby simultaneously exposing each of said first and second inclined surfaces to a plasma stream at said angle so that a deposition layer may form on each of said surfaces simultaneously.

8. The method of claim 4, further including the steps of applying a first voltage bias and then applying a second voltage bias to the blade while said deposition of vaporized carbon is occurring on the blade.

9. The method of claim 8 wherein said first voltage bias is in the range of 200 to 2,000 volts and said second voltage bias is in the range of 10 to 200 volts.

10. The method of claim 9 wherein said first voltage bias is applied for a duration up to two minutes.

11. The method of claim 1 wherein said blade is held within a holder containing a plurality of blades, and said steps of orienting a blade and presenting said blade are performed on said blade while within the holder.

12. The method of claim 1, wherein said step of exposing each of the first and second inclined surfaces of the cutting edge of the blade includes the further step of moving the set of blades and the plasma stream relative to one another, thereby sequentially exposing each of said first and second inclined surfaces to said plasma stream so that an incremental deposition layer may form on each of said surfaces during said sequential exposure.

13. The method of claim 12, wherein said incremental deposition layer is in the range of 3 Å to 500 Å and said moving step is repeated until at least two incremental deposition layers are deposited on each of the first and second inclined surfaces of the cu ting edge of the blade.

14. The method of claim 1, further including the steps of applying a first voltage bias and then applying a second voltage bias to the blade while said deposition of vaporized carbon is occurring on the blade.

15. The method of claim 14 wherein said first voltage bias is in the range of 200 to 2,000 volts and said second voltage bias is in the range of 10 to 200 volts.

16. The method of claim 15 wherein said first voltage bias is applied for a duration up to two minutes.

17. A method for applying a hard carbon coating to a blade having a cutting edge bounded by a first inclined surface and a second inclined surface, said method comprising the steps of:
   (a) applying an arc discharge to an evaporable carbon surface of a cathode, thereby generating a plasma stream of vaporized carbon,
   (b) orienting a blade to be coated within said plasma stream so that deposition of said vaporized carbon occurs on the cutting edge of the blade, and
   (c) presenting said blade in relation to the plasma stream so that said deposition of vaporized carbon occurs on said first inclined surface of the cutting edge of the blade and on the second inclined surface of the cutting edge of the blade,
   (d) wherein said deposition of vaporized carbon on said first and second inclined surfaces of the cutting edge occurs at an approximately equal average rate of deposition,
   (e) wherein said blade is held within a stack containing a plurality of stacked blades, and said steps of orienting a blade and presenting said blade are performed simultaneously on said plurality of stacked blades,
   (f) wherein each of said plurality of blades within said stack has a tip at the juncture of the first and second inclined surfaces of the cutting edge of the blade and the blades are stacked so that the tips describe a plane,
   (g) wherein said plasma stream is a generally directional stream resolvable into a set of roughly parallel lines,
   (h) wherein said step of orienting a blade further comprises the step of so disposing the blade that an angle defined by a line normal to said plane and one of said set of roughly parallel lines is within the range of 20° to 90°, thereby exposing one of said first and second inclined surfaces of the cutting edge of the blade to the plasma stream at said angle,
   (i) wherein said step of presenting includes the step of exposing each of the first and second inclined surfaces of the cutting edge of the blade to the plasma stream at said angle,
   (j) wherein said step of exposing each of the first and second inclined surfaces of the cutting edge of the blade includes the further step of moving the stack of blades and the plasma stream relative to one another, thereby sequentially exposing each of said first and second inclined surfaces to said plasma stream so that an incremental deposition layer may form on each of said surfaces during said sequential exposure.

18. The method of claim 17, wherein said incremental deposition layer is in the range of 3 Å to 500 Å and said moving step is repeated until at least two incremental deposition layers are deposited on each of the first and second inclined surfaces of the cutting edge of the blade.

19. A method for applying a hard carbon coating to a blade having a cutting edge bounded by a first inclined surface and a second inclined surface, said method comprising the steps of:
   (a) applying an arc discharge to an evaporable carbon surface of a cathode, thereby generating a plasma stream of vaporized carbon,
   (b) orienting a blade to be coated within said plasma stream so that deposition of said vaporized carbon occurs on the cutting edge of the blade, and
   (c) presenting said blade in relation to the plasma stream so that said deposition of vaporized carbon occurs on said first inclined surface of the cutting edge of the blade and on the second inclined surface of the cutting edge of the blade,
   (d) wherein said deposition of vaporized carbon on said first and second inclined surfaces of the cutting edge occurs at an approximately equal average rate of deposition,
   (e) wherein said blade is held within a stack containing a plurality of stacked blades, and said steps of orienting a blade and presenting said blade are performed simultaneously on said plurality of stacked blades,
   (f) wherein each of said plurality of blades within said stack has a tip at the juncture of the first and second inclined surfaces of the cutting edge of the blade and the blades are stacked so that the tips describe a plane,
   (g) wherein said plasma stream is a generally directional stream resolvable into a set of roughly parallel lines,
   (h) wherein said step of orienting a blade further comprises the step of so disposing the blade that an angle defined by a line normal to said plane and one of said set of roughly parallel lines is within the range of 20° to 90°, thereby exposing one of said first and second inclined surfaces of the cutting edge of the blade to the plasma stream at said angle,
   (i) wherein said step of presenting includes the step of exposing each of the first and second inclined surfaces of the cutting edge of the blade to the plasma stream at said angle, and
   (j) further including the steps of applying a first voltage bias and then applying a second voltage bias to the blade while said deposition of vaporized carbon is occurring on the blade.

20. The method of claim 19 wherein said first voltage bias is in the range of 200 to 2,000 volts and said second voltage bias is in the range of 10 to 200 volts.

21. The method of claim 20 wherein said first voltage bias is applied for a duration up to two minutes.

22. A method for applying a hard carbon coating to a blade having a cutting edge bounded by a first inclined surface and a second inclined surface, said method comprising the steps of:

(a) applying an arc discharge to an evaporable carbon surface of a cathode, thereby generating a plasma stream of vaporized carbon, (b) orienting a blade to be coated within said plasma stream so that deposition of said vaporized carbon occurs on the cutting edge of the blade, and (c) presenting said blade in relation to the plasma stream so that said deposition of vaporized carbon occurs on said first inclined surface of the cutting edge of the blade and on the second inclined surface of the cutting edge of the blade, (d) wherein said deposition of vaporized carbon on said first and second inclined surfaces of the cutting edge occurs at an approximately equal average rate of deposition, (e) wherein said blade is held within a holder containing a plurality of blades, and said steps of orienting a blade and presenting said blade are performed on said blade while within the holder, (f) wherein each of said plurality of blades within said holder has a tip at the juncture of the first and second inclined surfaces of the cutting edge of the blade and encloses a first angle defined by the tip and the first and second inclined surfaces, (g) wherein said plasma stream is a generally directional stream resolvable into a set of roughly parallel lines, and (h) wherein said step of orienting a blade further comprises the step of so disposing the blade that a second angle defined by a line bisecting said first angle and one of said set of roughly parallel lines is within the range of 20° to 90°, thereby exposing one of said first and second inclined surfaces of the cutting edge of the blade to the plasma stream at said angle, (i) wherein said step of presenting includes the step of exposing each of the first and second inclined surfaces of the cutting edge of the blade to the plasma stream at said angle, and (j) wherein said step of exposing each of the first and second inclined surfaces of the cutting edge of the blade includes the further step of moving the set of blades and the plasma stream relative to one another, thereby sequentially exposing each of said first and second inclined surfaces to said plasma stream so that an incremental deposition layer may form on each of said surfaces during said sequential exposure.

23. The method of claim 22, wherein said incremental deposition layer is in the range of 3 Å to 500 Å and said moving step is repeated until at least two incremental deposition layers are deposited on each of the first and second inclined surfaces of the cutting edge of the blade.

24. A method for applying a hard carbon coating to a blade having a cutting edge bounded by a first inclined surface and a second inclined surface, said method comprising the steps of:

(a) applying an arc discharge to an evaporable carbon surface of a cathode, thereby generating a plasma stream of vaporized carbon, (b) orienting a blade to be coated within said plasma stream so that deposition of said vaporized carbon occurs on the cutting edge of the blade, and (c) presenting said blade in relation to the plasma stream so that said deposition of vaporized carbon occurs on said first inclined surface of the cutting edge of the blade and on the second inclined surface of the cutting edge of the blade, (d) wherein said deposition of vaporized carbon on said first and second inclined surfaces of the cutting edge occurs at an approximately equal average rate of deposition, (e) wherein said blade is held within a holder containing a plurality of blades, and said steps of orienting a blade and presenting said blade are performed on said blade while within the holder, (f) wherein each of said plurality of blades within said holder has a tip at the juncture of the first and second inclined surfaces of the cutting edge of the blade and encloses a first angle defined by the tip and the first and second inclined surfaces, (g) wherein said plasma stream is a generally directional stream resolvable into a set of roughly parallel lines, and (h) wherein said step of orienting a blade further comprises the step of so disposing the blade that a second angle defined by a line bisecting said first angle and one of said set of roughly parallel lines is within the range of 20° to 90°, thereby exposing one of said first and second inclined surfaces of the cutting edge of the blade to the plasma stream at said angle, (i) wherein said step of presenting includes the step of exposing each of the first and second inclined surfaces of the cutting edge of the blade to the plasma stream at said angle, (j) further including the steps of applying a first voltage bias and then applying a second voltage bias to the blade while said deposition of vaporized carbon is occurring on the blade.

25. The method of claim 24 wherein said first voltage bias is in the range of 200 to 2,000 volts and said second voltage bias is in the range of 10 to 200 volts.

26. The method of claim 25 wherein said first voltage bias is applied for a duration up to two minutes.

* * * * *